(12) United States Patent
Hirano

(10) Patent No.: US 6,814,767 B2
(45) Date of Patent: Nov. 9, 2004

(54) POLISHING COMPOSITION

(75) Inventor: Tatsuhiko Hirano, Aichi (JP)

(73) Assignee: Fujimi Incorporated (JP)

( * ) Notice: Subject to any disclaimer, the term of this patent is extended or adjusted under 35 U.S.C. 154(b) by 0 days.

(21) Appl. No.: 10/675,021

(22) Filed: Sep. 30, 2003

(65) Prior Publication Data

US 2004/0134376 A1 Jul. 15, 2004

(30) Foreign Application Priority Data

Oct. 2, 2002 (JP) ........................ 2002-290458

(51) Int. Cl.$^7$ ............................ C09G 1/02; C09G 1/04
(52) U.S. Cl. ............................................ 51/308; 106/3
(58) Field of Search ............................. 51/308; 106/3; 438/692, 693; 252/79.1

(56) References Cited

U.S. PATENT DOCUMENTS

| | | | |
|---|---|---|---|
| 5,391,258 A | 2/1995 | Brancaleoni et al. | 156/636 |
| 5,476,606 A | 12/1995 | Brancaleoni et al. | 252/79.1 |
| 5,858,813 A | 1/1999 | Scherber et al. | 438/693 |
| 5,954,997 A | 9/1999 | Kaufman et al. | 252/79.1 |
| 6,063,306 A | 5/2000 | Kaufman et al. | 252/79.4 |
| 6,126,853 A | 10/2000 | Kaufman et al. | 252/79.1 |
| 6,139,763 A | 10/2000 | Ina et al. | 216/89 |
| 6,217,416 B1 | 4/2001 | Kaufman et al. | 451/41 |
| 6,315,803 B1 | 11/2001 | Ina et al. | 51/307 |
| 6,355,075 B1 | 3/2002 | Ina et al. | 51/308 |
| 6,432,828 B2 | 8/2002 | Kaufman et al. | 438/693 |
| 6,440,186 B1 | 8/2002 | Sakai et al. | 51/308 |
| 6,447,371 B2 | 9/2002 | Brusic Kaufman et al. | 451/36 |
| 6,565,619 B1 | 5/2003 | Asano et al. | 51/308 |
| 2002/0017630 A1 | 2/2002 | Uchida et al. | 252/79 |
| 2002/0096659 A1 | 7/2002 | Sakai et al. | 252/79 |
| 2002/0139055 A1 | 10/2002 | Asano et al. | 51/308 |
| 2003/0051413 A1 | 3/2003 | Sakai et al. | 51/307 |

FOREIGN PATENT DOCUMENTS

| | | |
|---|---|---|
| JP | 2000-160139 | 6/2000 |
| JP | 2001-089747 | 4/2001 |

*Primary Examiner*—Michael Marcheschi
(74) *Attorney, Agent, or Firm*—Vidas, Arrett & Steinkraus PA

(57) ABSTRACT

The present invention provides a polishing composition that inhibits the occurrence of erosion. The polishing composition contains silicon oxide, a polyoxyethylene alkyl ether sulfate, a benzotriazole corrosion inhibitor, an acid, and water. The silicon oxide is preferably colloidal silica, the acid is preferably lactic acid, and the pH of the polishing composition is preferably 1.5 to 4.0.

17 Claims, 2 Drawing Sheets

POLISHING COMPOSITION

BACKGROUND OF THE INVENTION

The present invention relates to a polishing composition used in the polishing process for example for forming wirings for semiconductor devices.

High-density, high-speed ULSIs are manufactured in accordance with fine design rules. In order to inhibit the elevation of wiring resistance due to the refinement wirings on semiconductor devices, copper is used as a wiring material.

Since metallic materials containing copper have characteristics that processing by anisotropic etching is difficult, a wiring formed from a metallic material containing copper is formed using the following chemical mechanical polishing (CMP) method.

First, a wiring trench is formed in an insulating film. A barrier film of tantalum or a tantalum compound such as tantalum nitride is formed on the insulating film. A conductive layer of a metallic material containing copper is formed on the barrier film so that at least the wiring trench is completely buried. The conductive film is polished until the upper surface of the barrier film is exposed (first polishing). Next, the barrier film is polished until the upper surface of the insulating film is exposed (second polishing). Thereby, a wiring is formed in the wiring trench.

Japanese Patent Laid-Open No. 2000-160139 discloses a first prior art polishing composition containing a polishing ingredient such as silicon oxide, an oxidizing ingredient such as hydrogen peroxide, a reductant such as oxalic acid, and water. Japanese Patent Laid-Open No. 2001-89747 discloses a second prior art polishing composition containing a polishing ingredient such as silicon oxide, oxalic acid, ethylenediamine or the derivative thereof, benzotriazole or the derivative thereof, and water. The polishing ingredient has the function to mechanically polish a surface. The oxidizing agent, the reductant, and oxalic acid have the function to accelerate the polishing of a barrier film.

However, when the polishing compositions of the first and second prior art are used in the above-described second polishing process, the level of the upper surface of the insulating layer in the wiring region becomes lower than the level of the upper surface of the insulating layer in the region other than the wiring region, and local erosion occurs (refer to FIG. 3).

SUMMARY OF THE INVENTION

The object of the present invention is to provide a composition for polishing semiconductor devices that does not easily cause erosion.

To achieve the above object, one aspect of the present invention is a polishing composition, used in a manufacturing process of a device that includes an insulating layer having a wiring trench formed therein, a barrier film formed on said insulating layer, and a conductive layer formed on said barrier film to bury said wiring trench. The polishing composition can be used for polishing said barrier film to expose an upper surface of said insulating layer, and includes silicon oxide and a polyoxyethylene alkyl ether sulfate represented by formula 1.

wherein $R^1$ is an alkyl group having 3 to 20 carbon atoms, n is an integer from 2 to 30, and X is sodium, potassium, ammonium, or triethanolamine. The composition further includes a benzotriazole corrosion inhibitor; at least one acid selected from a group consisting of nitric acid, hydrochloric acid, sulfuric acid, lactic acid, acetic acid, oxalic acid, citric acid, malic acid, succinic acid, butyric acid, and malonic acid; and water.

Another aspect of the present invention is a method for manufacturing a polishing composition, used in a manufacturing process of a device that includes an insulating layer having a wiring trench formed therein, a barrier film formed on said insulating layer, and a conductive layer formed on said barrier film so as to bury said wiring trench, said method comprising a step of mixing silicon oxide; a polyoxyethylene alkyl ether sulfate represented by formula 1,

where, $R^1$ is an alkyl group having 3 to 20 carbon atoms, n is an integer from 2 to 30, and X is sodium, potassium, ammonium, or triethanolamine, a benzotriazole corrosion inhibitor; at least one acid selected from a group consisting of nitric acid, hydrochloric acid, sulfuric acid, lactic acid, acetic acid, oxalic acid, citric acid, malic acid, succinic acid, butyric acid, and malonic acid; and water.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawing, in which.

DETAILED DESCRIPTION OF THE PREFERRED EMBODIMENTS

Figure 1:
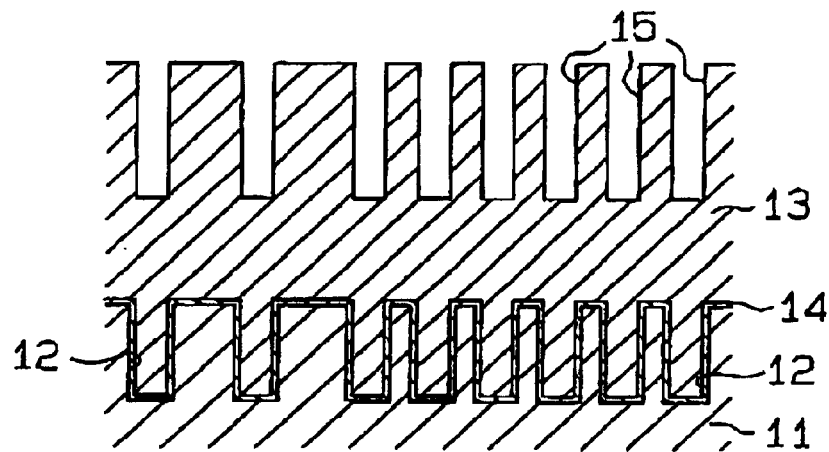
FIGS. 1 to 3 are enlarged sectional views of essential portions for schematically illustrating the polishing method according to an embodiment of the present invention.

First, a method will be described for forming a wiring in a semiconductor device. As FIG. 1 shows, an insulating layer 11 is laminated on a semiconductor substrate (not shown). Wiring trenches 12 having a predetermined design pattern are formed in the insulating layer 11 using lithography and pattern etching techniques well known in the art. The examples of the insulating layers 11 include a SiO$_2$ film, SiOF film, and SiOC film formed by the CVD (chemical vapor deposition) method using TEOS (tetraethoxysilane).

The surfaces of the wiring trenches 12 are generally covered with a barrier film 14 formed by sputtering. The barrier film 14 is formed from tantalum or a tantalum-containing compound such as tantalum nitride.

Then, a conductive film 13 is formed on the barrier film 14 using a metallic material containing copper so that at least the wiring trenches 12 are completely buried. The specific examples of the metallic materials containing copper include copper, a copper-aluminum alloy, and a copper-titanium alloy. On the upper surface of the conductive film 13 are formed initial depressed portions 15 corresponding to the wiring trenches 12.

The conductive film 13 and the barrier film 14 are polished using the CMP method until the upper surface of the insulating layer 11 is exposed. Wirings are formed of the conductive film 13 remaining in the wiring trenches 12. The barrier film 14 has the function of preventing the diffusion of copper in the conductive film 13 into the insulating layer 11.

Figure 2:
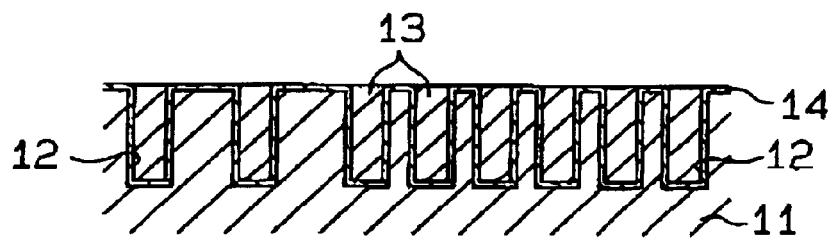
Figure 3:
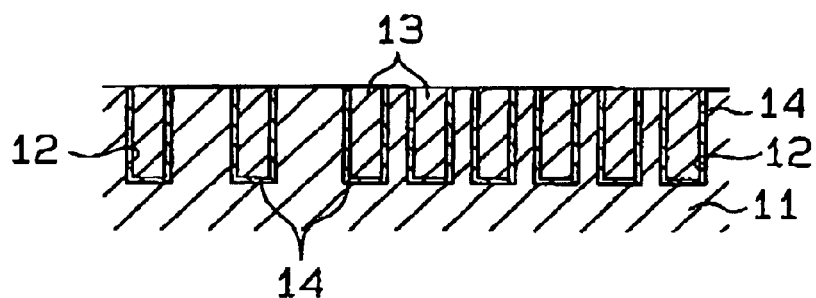

In the CMP method, as FIG. 2 shows, the conductive film 13 is polished until the upper surface of the barrier film 14 is exposed (first polishing). Thereafter, as FIG. 3 shows, the barrier film 14 is polished until the upper surface of the insulating layer 11 is exposed (second polishing). An embodiment relates to a polishing composition used in the second polishing process.

The polishing composition of an embodiment contains the following ingredients A to E:
Ingredient A: silicon oxide;
Ingredient B: a polyoxyethylene alkyl ether sulfate represented by formula 1,

$$R^1-O-(C_2H_4O)_n SO_3-X \tag{1}$$

where, $R^1$ is an alkyl group having 3 to 20 carbon atoms, n is an integer from 2 to 30, and X is sodium, potassium, ammonium, or triethanolamine;
Ingredient C: a benzotriazole corrosion inhibitor;
Ingredient D: at least one acid selected from a group consisting of nitric acid, hydrochloric acid, sulfuric acid, lactic acid, acetic acid, oxalic acid, citric acid, malic acid, succinic acid, butyric acid, and malonic acid; and
Ingredient E: water.

Ingredient A, or silicon oxide, has the function of mechanically polishing the surface to be polished. The specific examples of silicon oxide include various types of silica having different properties manufactured by different methods, such as colloidal silica and fumed silica, and these can be contained alone, or two or more types can be combined. Among these, colloidal silica is preferred because of the high effect for inhibiting the formation of defects on the surface to be polished, The particle diameter of silicon oxide obtained from the specific surface area measured by the nitrogen adsorption method (BET method) is preferably 2 to 100 nm, and more preferably 10 to 30 nm. If the particle diameter of silicon oxide is less than 2 nm, the speed of polishing the barrier film is insufficient. On the other hand, if the particle diameter of silicon oxide exceeds 100 nm, the speed of polishing the insulating film is elevated, and the erosion depth e1 tends to increase.

Figure 4:
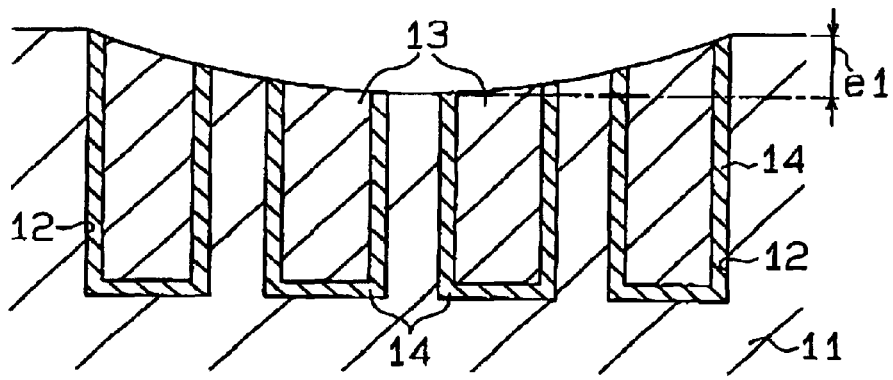
FIG. 4 is an enlarged sectional view of an essential portion for schematically showing erosion on the completion of the second polishing step.

As FIG. 4 shows, the erosion depth e1 is the difference between the level of the upper surface of the region where the wiring trenches 12 are densely formed (wiring region) and the level of the upper surface of the insulating layer 11 on the region other than the wiring region.

The content of silicon oxide in the polishing composition is preferably 5 to 50 g/liter, and more preferably 10 to 30 g/liter. If the content is less than 5 g/liter, the mechanical polishing capability of the polishing composition is insufficient due to the low content of silicon oxide, and a sufficient speed of polishing the barrier film cannot be obtained. On the other hand, if the content exceeds 50 g/liter, the speed of polishing the insulating film is elevated, the insulating film is polished, and the erosion depth e1 tends to increase.

Ingredient B, or a polyoxyethylene alkyl ether sulfate, is contained so as to reduce the erosion depth e1 and to inhibit the occurrence of erosion. In the general formula 1, n represents the adding number of ethylene oxide.

The polyoxyethylene alkyl ether sulfate wherein X in general formula 1 is ammonia is preferred because it has the function to inhibit the metallic contamination of wirings caused by metallic impurities in the polishing composition, and is easily available at a relatively low price.

Here, the metallic contamination of wirings means the adhesion of metallic impurities on the surface of the insulating film or the diffusion of metallic impurities into the insulating film during polishing. The wiring contaminated by metallic impurities causes short-circuiting or leakage, and insulation failure by metallic impurities adhered on the surface of the insulating film or the impurities diffused into the insulating film.

The polyoxyethylene alkyl ether sulfate wherein $R^1$ in general formula 1 is a straight-chain alkyl group is preferable because it is easily available at a relatively low price. Furthermore, the polyoxyethylene alkyl ether sulfate wherein $R^1$ in general formula 1 is a straight-chain alkyl group having 10 to 15 carbon atoms is more preferable because it can improve the stability of the polishing composition, and polyoxyethylene lauryl ether sulfate represented by general formula 3 is most preferable.

$$CH_3(CH_2)_{11}-O-(CH_2CH_2O)_n SO_3-X \tag{3}$$

In formula 3, n represents an integer from 2 to 30, and X represents sodium, potassium, ammonium, or triethanolamine.

The content of the polyoxyethylene alkyl ether sulfate in the polishing composition is preferably 0.02 to 4 g/liter, and more 0.1 to 0.5 g/liter. If the content is less than 0.02 g/liter, the effect to reduce the erosion depth e1 is low because of the low content of the polyoxyethylene alkyl ether sulfate, and the prevention of the occurrence of erosion becomes difficult. On the other hand, if the content exceeds 4 g/liter, the polishing composition tends to be easily aggregated.

Ingredient C, or a benzotriazole corrosion inhibitor, is contained for protecting the surface of the conductive film from corrosion by acid, and preventing the corrosion thereof. Here, the benzotriazole corrosion inhibitor is at least one compound selected from a group consisting of benzotriazole represented by general formula 4, and the derivatives thereof.

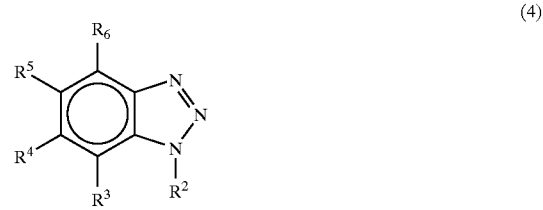

(4)

In formula 4, $R^2$ represents a hydrogen atom, an alkyl group containing a carboxyl group, an alkyl group containing a hydroxyl group and a tertiary amino group, an alkyl group containing a hydroxyl group, or an alkyl group; and $R^3$ to $R^6$ represent hydrogen atoms or alkyl groups. The carbon atom on the fourth, fifth, sixth or seventh position may be substituted by a nitrogen atom; and the nitrogen atom on the first position may be substituted by a carbon atom.

The benzotriazole corrosion inhibitor is preferably a derivative of benzotriazole represented by general formula 2, because the effect to protect the surface of the conductive film from corrosion caused by acid is high.

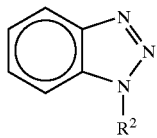
(2)

In formula 2, $R^2$ represents a hydrogen atom, an alkyl group containing carboxyl groups, an alkyl group containing hydroxyl groups and tertiary amino groups, an alkyl group containing hydroxyl groups, or an alkyl group.

The derivatives of benzotriazole wherein $R^2$ in general formula 2 is an alkyl group having carboxyl groups include the compound represented by general formula 5, and 1-(1,2-dicarboxyethyl) benzotriazole represented by general formula 6.

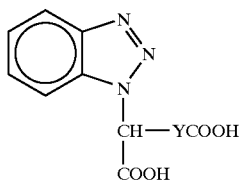
(5)

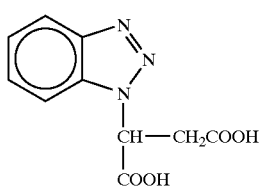
(6)

The derivatives of benzotriazole wherein $R^2$ is an alkyl group having hydroxyl groups and tertiary amino groups include the compound represented by general formula 7, and 1-[N,N-bis(hydroxyethyl)aminomethyl] benzotriazole represented by general formula 8.

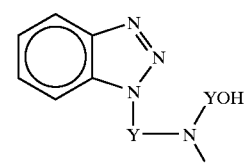
(7)

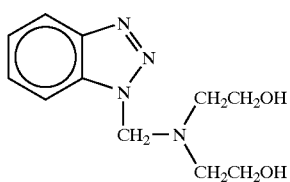
(8)

The derivatives of benzotriazole wherein $R^2$ is an alkyl group having hydroxyl groups include the compounds represented by general formulas 9 and 10, 1-(2,3-dihydroxypropyl)benzotriazole represented by general formula 11, and 1-(hydroxymethyl)benzotriazole represented by general formula 12.

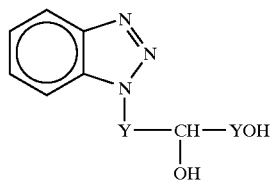
(9)

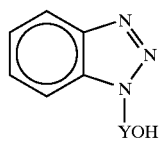
(10)

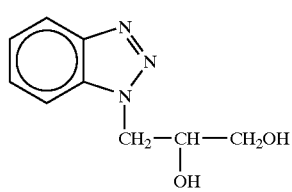
(11)

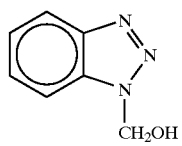
(12)

In general formulas 5, 7, 9, and 10, Y represent an alkylene group.

The benzotriazole corrosion inhibitor may be used alone, or may be used in combination of two or more. The benzotriazole corrosion inhibitor is preferably 1-[N,N-bis(hydroxyethyl)aminomethyl] benzotriazole represented by general formula 8, because the effect to protect the surface of the conductive film from corrosion caused by acid is high.

The content of the benzotriazole corrosion inhibitor in the polishing composition is preferably 0.5 to 10 g/liter, and more preferably 1 to 5 g/liter. If the content if less than 0.5 g/liter, the surface of the conductive film is not sufficiently protected from corrosion caused by acid, and the surface of the conductive film is easily corroded. On the other hand, if the content exceeds 10 g/liter, the dissolution of the benzotriazole corrosion inhibitor in water becomes difficult in the preparation of the polishing composition, and the benzotriazole corrosion inhibitor may precipitate in the polishing composition when the temperature thereof lowers during storage or transportation.

Ingredient D, or an acid, has the function to improve the speed of polishing the barrier film. The acid is preferably lactic acid, which effectively improves the speed of polishing the barrier film, and is difficult to corrode the surface of the conductive film.

The content of the acid in the polishing composition is preferably 1 to 20 g/liter, and more preferably 3 to 10 g/liter. If the content of the acid is less than 1 g/liter, the speed of polishing the barrier film is insufficient. On the other hand, if the content of the acid exceeds 20 g/liter, the speed of polishing the insulating film elevates, and the erosion depth e1 tends to increase.

Ingredient E, or water, functions as the dispersion medium or solvent of Ingredients A to D. The water containing as little impurities that interfere with the functions of Ingredients A to D as possible is preferred. The specific examples include pure water or ultra-pure water made of water from which impurity ions have been removed using ion-exchange resins, and has been passed through a filter to remove foreign substances, or distilled water.

If a part of the conductive film to be removed remains after the first polishing process, it is preferable to contain hydrogen peroxide to polish the remaining conductive film. Hydrogen peroxide is contained in order to improve the speed of polishing the conductive film.

The content of hydrogen peroxide in the polishing composition is preferably 1 to 30 g/liter. If the content in less than 1 g/liter, the speed of polishing the conductive film is insufficient because the content of hydrogen peroxide is too low. On the other hand, if the content exceeds 30 g/liter, the speed of polishing the conductive film is restrained rather than being accelerated, and the polishing is not only uneconomical, but the speed of polishing the conductive film might be insufficient.

In addition to hydrogen peroxide the polishing composition may contain additional ingredients such as a defoaming agent. The content of the additional ingredients is determined in accordance with the normal practice of the polishing composition.

In order to improve the speed of polishing the barrier film, the pH of the polishing composition is preferably 1.5 to 4.0, and more preferably 2 to 3. The polishing composition having pH of lower than 1.5 may cause corrosion of the polishing apparatus, and care should be taken for the handling of the polishing composition. On the other hand, if the pH of the polishing composition exceeds 4, the speed of polishing the barrier film becomes insufficient because of a low acid content.

The polishing composition may be manufactured in the state so as to be diluted by deficient water when used in polishing. The thus concentrated polishing composition is easy to store and transport.

The volume ratio of the concentrated polishing composition to water is preferably the polishing composition: water for diluting=1:1 to 1:3. In other words, the concentrating multiplying factor of the polishing composition is preferably 2 to 4. If the polishing composition is excessively concentrated, the polishing composition becomes unstable, silicon oxide is not dispersed, and other ingredients may be precipitated.

The polishing composition is prepared by adding Ingredients A, B, C, and D to water, and dispersing or agitating using a blade-type agitator or an ultrasonic dispersing apparatus. The order of adding Ingredients A, B, C, and D to water is not specifically limited.

Next the method will be described for forming wirings. As FIG. 2 shows, the conductive film 13 is first polished until the upper surface of the barrier film 14 is exposed (first polishing). Then, as FIG. 3 shows, the barrier film 14 is polished by CMP using the polishing composition of the present invention until the upper surface of the insulating layer 11 is exposed (second polishing). In second polishing, polyoxyethylene alkyl ether sulfate prevents the conductive film 13 in the wiring trenches 12 from being polished, the level of the upper surface thereof from being lowered, and polishing stress from concentrating on the upper surface of the insulating layer 11. Therefore, the erosion depth e1 is reduced.

According to this embodiment, the following advantages can be obtained.

The polyoxyethylene alkyl ether sulfate in the polishing composition reduces the erosion depth e1. The benzotriazole corrosion inhibitor in the polishing composition prevents the corrosion by the acid on the surface of the conductive film. The acid in the polishing composition improves the speed of polishing the barrier film. Since the polishing composition has a high polishing efficiency, and does not corrode the surface of the conductive film, the yield of semiconductor devices is improved.

When a polyoxyethylene alkyl ether sulfate wherein $R^1$ in general formula 1 is a straight-chain alkyl group having 10 to 15 carbon atoms is used, the polishing composition has high stability, and is inexpensive.

When polyoxyethylene lauryl ether ammonium sulfate is used, the polishing composition can inhibit the contamination of wirings by metallic impurities.

When the polishing composition contains 1-[N,N-bis (hydroxyethyl)aminomethyl] benzotriazole represented by formula 8, the acid corrosion of the surface of the conductive film is reliably prevented.

The embodiment may be modified as follows:

In the CMP method, after the conductive film is polished so as to complete polishing before the barrier film is exposed as the first polishing step, the conductive film may be polished until the barrier film is exposed as the second polishing step, and the barrier film may be polished until the insulating film is exposed as the third polishing step. In this case, the polishing composition of this embodiment is used in the third polishing step.

In the case of the polishing composition containing hydrogen peroxide, the composition is prepared and stored in the state where the hydrogen peroxide is separated from other ingredients, and the hydrogen peroxide may be added to the other ingredients immediately before using. In this case, the decomposition of hydrogen peroxide in the polishing composition can be inhibited when the polishing composition is stored for a long period of time.

In the first polishing step, polishing may be performed using the polishing composition composed so that the speed of polishing the conductive film can be high. In this case, the polishing efficiency can be improved by shortening the polishing time in the first polishing step.

Next, the examples and comparative examples will be described.

EXAMPLES 1 TO 23 AND COMPARATIVE EXAMPLES 1 TO 9

Each ingredient shown in Table 1 was mixed with water to prepare the polishing compositions of Examples 1 to 23 and Comparative Examples 1 to 9.

Silicon oxide was colloidal silica having an average particle diameter of 12 nm with the diameter determined from the specific surface area and the particle density measured by the BET method. For the measurement of the specific surface area of the colloidal silica, FlowSorb II 2300 (manufactured by Micromeritics Instrument Corporation) was used.

The polishing composition of Examples 17 and 18 contain 0.03 g/liter of a defoaming agent as an additional ingredient. The polishing composition of Example 18 contains 3 g/liter of hydrogen peroxide.

TABLE 1

| Examples | SiO₂ (g/liter) | Surfactant | (g/liter) | Corrosion Inhibitor | (g/liter) | Acid | (g/liter) | Erosion Depth e1 (Å) |
|---|---|---|---|---|---|---|---|---|
| 1 | 5 | A | 0.25 | F | 2 | J | 5 | 0 |
| 2 | 10 | A | 0.25 | F | 2 | J | 5 | 0 |
| 3 | 30 | A | 0.25 | F | 2 | J | 5 | 0 |
| 4 | 50 | A | 0.25 | F | 2 | J | 5 | 50 |
| 5 | 10 | A | 0.02 | F | 2 | J | 5 | 50 |
| 6 | 10 | A | 0.1 | F | 2 | J | 5 | 20 |
| 7 | 10 | A | 0.5 | F | 2 | J | 5 | 0 |
| 8 | 10 | A | 4 | F | 2 | J | 5 | 0 |
| 9 | 10 | A | 0.25 | F | 0.5 | J | 5 | 0 |
| 10 | 10 | A | 0.25 | F | 1 | J | 5 | 0 |
| 11 | 10 | A | 0.25 | F | 5 | J | 5 | 0 |
| 12 | 10 | A | 0.25 | F | 10 | J | 5 | 0 |
| 13 | 10 | A | 0.25 | F | 2 | J | 1 | 0 |
| 14 | 10 | A | 0.25 | F | 2 | J | 3 | 0 |
| 15 | 10 | A | 0.25 | F | 2 | J | 10 | 0 |
| 16 | 10 | A | 0.25 | F | 2 | J | 20 | 0 |
| 17 | 10 | A | 0.25 | F | 2 | J | 5 | 0 |
| 18 | 10 | A | 0.25 | F | 2 | J | 5 | 0 |
| 19 | 10 | B | 0.25 | F | 2 | J | 5 | 0 |
| 20 | 10 | A | 0.25 | G | 2 | J | 5 | 0 |
| 21 | 10 | A | 0.25 | H | 2 | J | 5 | 0 |
| 22 | 10 | A | 0.25 | I | 2 | J | 5 | 0 |
| 23 | 10 | A | 0.25 | F | 2 | K | 5 | 0 |

| Comparative Examples | SiO₂ (g/liter) | Surfactant | (g/liter) | Corrosion Inhibitor | (g/liter) | Acid | (g/liter) | Erosion Depth e1 (Å) |
|---|---|---|---|---|---|---|---|---|
| 1 | 0 | A | 0.25 | F | 2 | J | 5 | — |
| 2 | 10 | — | 0 | F | 2 | J | 5 | 400 |
| 3 | 10 | A | 0.25 | — | 0 | J | 5 | 0 |
| 4 | 10 | A | 0.25 | F | 2 | — | 0 | — |
| 5 | 10 | C1 | 0.25 | F | 2 | J | 5 | 400 |
| 6 | 10 | C2 | 0.25 | F | 2 | J | 5 | 400 |
| 7 | 10 | C3 | 0.25 | F | 2 | J | 5 | 400 |
| 8 | 10 | D | 0.25 | F | 2 | J | 5 | 450 |
| 9 | 10 | E | 0.25 | F | 2 | J | 5 | — |

The symbols in Table 1 denote the following compounds:
A: Polyoxyethylene lauryl ether ammonium sulfate
B: Polyoxyethylene lauryl ether sodium sulfate
C1: Polyammonium acrylate (average molecular weight: 1,000)
C2: Polyammonium acrylate (average molecular weight: 10,000)
C3: Polyammonium acrylate (average molecular weight: 100,000)
D: Ammonium alkylbenzene sulfonate (average molecular weight: 400)
E: Polyoxyethylene polyoxypropylene alkyl ether (average molecular weight: 8,000; proportion of hydrophilic groups to total molecular weight: 30%)
F: 1-[N,N-bis(hydroxyethyl)aminomethyl] benzotriazole
G: Benzotriazole
H: 1-(1,2-dicarboxyethyl)benzotriazole (compound of formula 6)
I: 1-(2,3-dihydroxypropyl)benzotriazole (compound of formula 11)
J: Lactic acid
K: Nitric acid A patterned wafer with a copper film was used as the article to be polished. The patterned wafer with a copper film was polished using Cu-polishing slurry (PLANERLITE-7101; manufactured by Fujimi Incorporated) until the barrier film was exposed (first polishing). After the first polishing, the dishing depth d and the erosion depth e2 of the conductive film 13 in wiring trenches 12 having a width of 10 μm were 1,000 angstroms and 0 angstroms, respectively.

Figure 5:
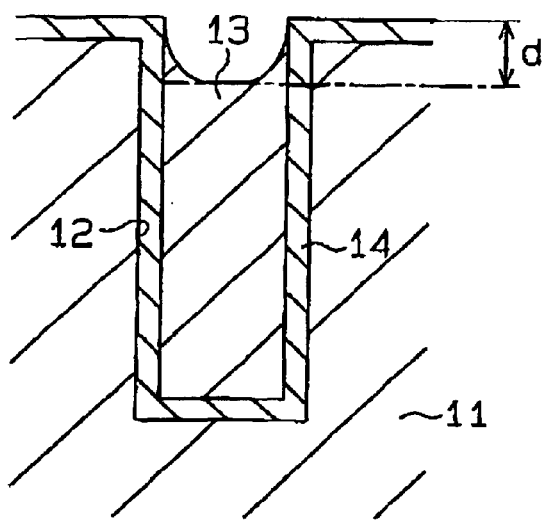
FIG. 5 is an enlarged sectional view of an essential portion for schematically showing dishing on the completion of the first polishing step.

As shown in FIG. 5, dishing indicates the lowering of the level of the upper surface of the conductive film 13 in each wiring trench 12. The dishing depth d is the difference between the level of the upper surface of the conductive film 13 and the level of the upper surface of the barrier film 14.

Figure 6:
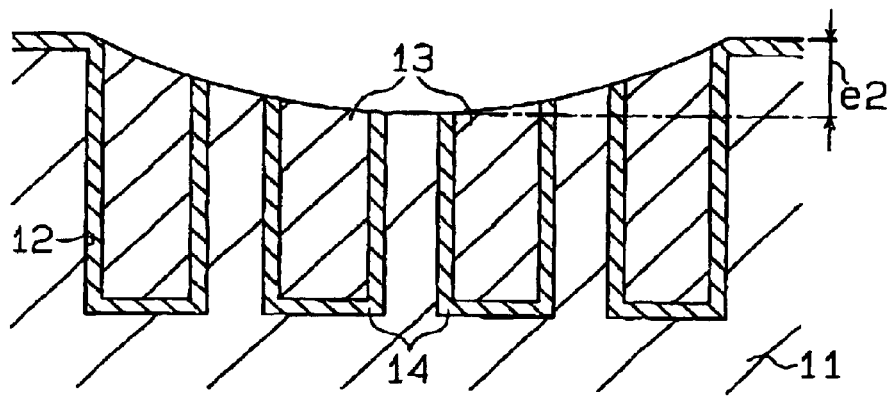
FIG. 6 is an enlarged sectional view of an essential portion for schematically showing erosion on the completion of the first polishing step.

As shown in FIG. 6, the erosion depth e2 is the difference between the level of the upper surface of the region where wiring trenches 12 are densely formed (wiring region) and the level of the upper surface of the barrier film 14 on the region other than the wiring region.

The erosion depth e1 of a patterned wafer with a copper film, in the wiring region having a plurality of 10-μm-wide wirings, was measured using a probe-type profiler (HRP340; manufactured by KLA-Tencor Corporation).

Then, the patterned wafer with a copper film after first polishing was polished using polishing composition of each example and comparative example (second polishing). After the end-point detection signal, which indicates that the upper surface of the insulating layer 11 was exposed, was obtained, second polishing was continued for further 20% excessive time. The conditions of second polishing were as follows:
Polishing machine: Polishing machine for one-side CMP (Mirra; manufactured by Applied Materials, Inc.)
Article to be polished: Patterned wafer with copper film (manufactured by SEMATECH, Inc.; having a 854 mask pattern insulating film (TEOS film) and a barrier film (tantalum film))

Polishing pad: IC-1000 (Trade name of Rodel Nitta Company)
Turntable rotation speed: 80 rpm
Carrier rotation speed: 80 rpm
Polishing pressure: 2.5 psi (about 17.3 kPa)
Feed speed of polishing composition: 200 ml/min As FIG. 1 shows, when polishing compositions of Examples 1 to 23 were used, it was known that the erosion depth e1 was small, and that the occurrence of erosion was inhibited.

When the polishing composition of Example 23 containing nitric acid in place of lactic acid was used, the time required for polishing was 1.5 times the polishing time of polishing compositions of Examples 1 to 22 containing lactic acid.

Polishing compositions of Comparative Examples 1 and 4 containing no silicon oxide or acid could not polish the tantalum film, and the erosion depth e1 could not be measured.

The polishing composition of Comparative Example 9 had low stability and was gelated. Therefore, the tantalum film could not be polished, and the erosion depth e1 could not be measured.

When polishing compositions of Comparative Examples 2 and 5 to 8 containing no polyoxyethylene alkyl ether sulfate were used, the erosion depth e1 showed high values.

Therefore, when polishing compositions of Comparative Examples 1, 4, and 9 were used, no wirings of semiconductor devices could be formed; and when polishing compositions of Comparative Examples 2 and 5 to 8 were used, erosion occurred. Since Comparative Example 3 contained no benzotriazole corrosion inhibitors, significant corrosion was observed on the surface of the conductive film, and the polished product could not be used as a semiconductor device.

The present examples and embodiments are to be considered as illustrative and not restrictive, and the invention is not to be limited to the details given herein, but may be modified within the scope and equivalence of the appended claims.

What is claimed is:

1. A polishing composition, used in a manufacturing process of a device that includes an insulating layer having a wiring trench formed therein, a barrier film formed on said insulating layer, and a conductive layer formed on said barrier film to bury said wiring trench, wherein said polishing composition used for polishing said barrier film to expose an upper surface of said insulating layer; said polishing composition comprising:
   silicon oxide;
   a polyoxyethylene alkyl ether sulfate represented by formula 1, $$R^1\text{—O—}(C_2H_4O)_n SO_3\text{—X} \quad (1)$$

wherein $R^1$ is an alkyl group having 3 to 20 carbon atoms, n is an integer from 2 to 30, and X is sodium, potassium, ammonium, or triethanolamine;
   a benzotriazole corrosion inhibitor;
   at least one acid selected from a group consisting of nitric acid, hydrochloric acid, sulfuric acid, lactic acid, acetic acid, oxalic acid, citric acid, malic acid, succinic acid, butyric acid, and malonic acid; and
   water.

2. The polishing composition according to claim 1, wherein $R^1$ in formula 1 is an alkyl group having 10 to 15 carbon atoms.

3. The polishing composition according to claim 1, wherein said polyoxyethylene alkyl ether sulfate is polyoxyethylene lauryl ether ammonium sulfate.

4. The polishing composition according to claim 1, wherein said benzotriazole corrosion inhibitor is a benzotriazole derivative represented by formula 2,

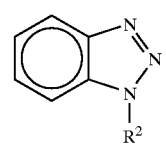

(2)

wherein $R^2$ is a hydrogen atom, an alkyl group containing a carboxyl group, an alkyl group containing a hydroxyl group and a ternary amino group, an alkyl group containing a hydroxyl group, or an alkyl group.

5. The polishing composition according to claim 4, wherein said benzotriazole corrosion inhibitor is 1-[N,N-bis(hydroxyethyl)aminomethyl] benzotriazole.

6. The polishing composition according to claim 1, wherein said acid is lactic acid.

7. The polishing composition according to claim 1, wherein the silicon oxide compounded in said polishing composition is in a quantity larger than 5 g/liter and smaller than 50 g/liter.

8. The polishing composition according to claim 7, wherein said silicon oxide is colloidal silica having a particle diameter of 10 to 30 nm.

9. The polishing composition according to claim 1, wherein the polyoxyethylene alkyl ether sulfate compounded in said polishing composition is in a quantity larger than 0.02 g/liter and smaller than 4 g/liter.

10. The polishing composition according to claim 1, wherein the benzotriazole corrosion inhibitor compounded in said polishing composition is in a quantity larger than 0.5 g/liter and smaller than 10 g/liter.

11. The polishing composition according to claim 1, wherein the acid compounded in said polishing composition is in a quantity larger than 1 g/liter and smaller than 20 g/liter.

12. The polishing composition according to claim 11, wherein the polishing composition has a pH that is in the range of 1.5 to 4.0.

13. A method for manufacturing a polishing composition, used in a manufacturing process of a device that includes an insulating layer having a wiring trench formed therein, a barrier film formed on said insulating layer, and a conductive layer formed on said barrier film so as to bury said wiring trench, said method comprising a step of mixing:
   silicon oxide;
   a polyoxyethylene alkyl ether sulfate represented by formula 1, $$R^1\text{—O—}(C_2H_4O)_n SO_3\text{—X} \quad (1)$$

where, $R^1$ is an alkyl group having 3 to 20 carbon atoms, n is an integer from 2 to 30, and X is sodium, potassium, ammonium, or triethanolamine;
   a benzotriazole corrosion inhibitor;
   at least one acid selected from a group consisting of nitric acid, hydrochloric acid, sulfuric acid, lactic acid, acetic acid, oxalic acid, citric acid, malic acid, succinic acid, butyric acid, and malonic acid; and
   water.

14. The method according to claim 13, wherein said silicon oxide is colloidal silica having a particle diameter of 10 to 30 nm, and the silicon oxide compounded in said polishing composition is in a quantity larger than 5 g/liter and smaller than 50 g/liter.

15. The method according to claim 13, wherein the polyoxyethylene alkyl ether sulfate compounded in said polishing composition is in a quantity larger than 0.02 g/liter and smaller than 4 g/liter.

16. The method according to claim 13, wherein the benzotriazole corrosion inhibitor compounded in said polishing composition is in a quantity larger than 0.5 g/liter and smaller than 10 g/liter.

17. The method according to claim 13, wherein the acid compounded in said polishing composition is in a quantity larger than 1 g/liter and smaller than 20 g/liter.

* * * * *